(12) United States Patent
Gangwar et al.

(10) Patent No.: US 10,318,243 B2
(45) Date of Patent: Jun. 11, 2019

(54) INTEGRATED CIRCUIT DESIGN

(71) Applicant: ARM Limited, Cambridge (GB)

(72) Inventors: Anup Gangwar, Bangalore (IN); Nitin Kumar Agarwal, Bangalore (IN)

(73) Assignee: ARM Limited, Cambridge (GB)

(*) Notice: Subject to any disclaimer, the term of this patent is extended or adjusted under 35 U.S.C. 154(b) by 0 days.

(21) Appl. No.: 15/711,054

(22) Filed: Sep. 21, 2017

(65) Prior Publication Data

US 2019/0087157 A1    Mar. 21, 2019

(51) Int. Cl.
    *G06F 17/50* (2006.01)
    *G06F 7/509* (2006.01)
    *H04L 12/773* (2013.01)

(52) U.S. Cl.
    CPC .......... *G06F 7/509* (2013.01); *G06F 17/5045* (2013.01); *H04L 45/60* (2013.01)

(58) Field of Classification Search
    CPC .............................. G06F 17/5045; H04L 45/60
    USPC ......................................... 716/101, 102, 104
    See application file for complete search history.

(56) References Cited

U.S. PATENT DOCUMENTS

| | | | |
|---|---|---|---|
| 5,434,972 A * | 7/1995 | Hamlin ................. | G06F 9/4494 709/238 |
| 7,127,696 B2 * | 10/2006 | Alpert et al. ......... | G06F 17/505 716/114 |
| 8,887,110 B1 * | 11/2014 | Zlatanovici et al. ........ | G06F 17/505 716/104 |
| 9,323,870 B2 * | 4/2016 | Chandra ................. | G06F 17/50 |

* cited by examiner

*Primary Examiner* — Sun J Lin
(74) *Attorney, Agent, or Firm* — Nixon & Vanderhye P.C.

(57) ABSTRACT

A computer-implemented method of generating an integrated circuit design comprises: using a computer, detecting communication paths between data handling nodes, the data handling nodes comprising data source nodes, data sink nodes and data routing nodes operating according to respective power domains, clock domains and data traffic parameters, in a network of the data handling nodes; using the computer, for a given communication path in a direction of data flow from a data source node to a data sink node, for each given data routing node in the given communication path to which data is communicated in the direction of data flow by a set of one or more other data handling nodes, to perform the following steps: (i) detecting a power domain and data traffic parameters of each data handling node of the set of one or more other data handling nodes communicating data to said each given data routing node; (ii) assigning a power domain to said each given data routing node in dependence upon the detected power domains and the detected data traffic parameters of the set of one or more other data handling nodes; and (iii) assigning a clock domain to said each given data routing node, from a set of one or more candidate clock domains applicable to the assigned power domain, so that said each given data routing node, operating in the assigned clock domain, provides data routing according to the detected data traffic parameters of at least those of the set of one or more other data handling nodes operating according to the assigned power domain of said each given data routing node.

18 Claims, 8 Drawing Sheets

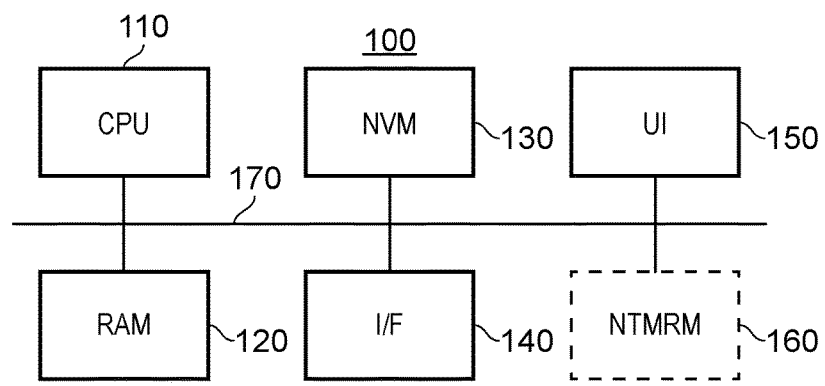
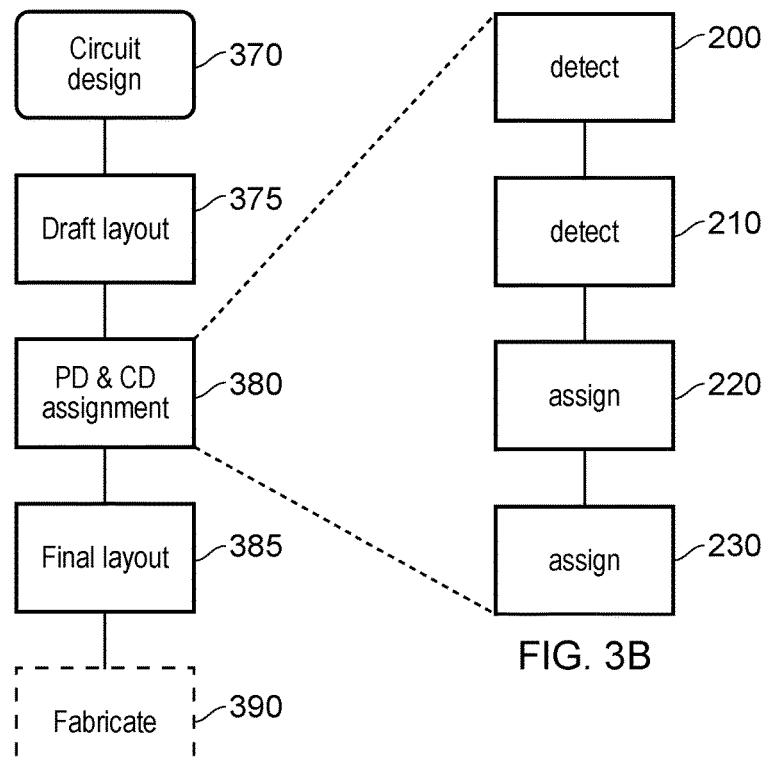
FIG. 1
FIG. 3A
FIG. 3B

INTEGRATED CIRCUIT DESIGN

BACKGROUND

This disclosure relates to integrated circuit design.

In the design of some integrated circuits such as (for example) so-called network on chip (NoC) devices, multiple data handling nodes are connected together to form data communication paths.

In the case of data communication paths between two data handling nodes associated with different power and/or clock domains, there can be a need for power and/or clock domain conversion at some point along the data communication path.

SUMMARY

In an example arrangement there is provided a computer-implemented method of integrated circuit design, the method comprising: using a computer, detecting communication paths between data handling nodes, the data handling nodes comprising data source nodes, data sink nodes and data routing nodes operating according to respective power domains, clock domains and data traffic parameters, in a network of data handling nodes; and using the computer, for a given communication path in a direction of data flow from a data source node to a data sink node, for each given data routing node in the given communication path to which data is communicated in the direction of data flow by a set of one or more other data handling nodes: (i) detecting a power domain and data traffic parameters of each of the set of one or more other data handling nodes communicating data to the given data routing node; (ii) assigning a power domain to the given data routing node in dependence upon the detected power domains and data traffic parameters of the set of one or more other data handling nodes; and (iii) assigning a clock domain to the given data routing node, from a set of one or more candidate clock domains applicable to the assigned power domain, so that the given data routing node, operating in the assigned clock domain, provides data routing according to the data traffic parameters of at least those of the set of one or more other data handling nodes operating according to the assigned power domain of the given data routing node.

In another example arrangement there is provided an integrated circuit having an integrated circuit design produced by the method defined above.

In another example arrangement there is provided a computer program product comprising a non-transitory machine-readable storage medium on which are stored program instructions which, when executed by a computer processor, cause the computer processor to perform a method of integrated circuit design, the method comprising: detecting communication paths between data handling nodes, the data handling nodes comprising data source nodes, data sink nodes and data routing nodes operating according to respective power domains, clock domains and data traffic parameters, in a network of data handling nodes; and for a given communication path in a direction of data flow from a data source node to a data sink node, for each given data routing node in the given communication path to which data is communicated in the direction of data flow by a set of one or more other data handling nodes: (i) detecting a power domain and data traffic parameters of each of the set of one or more other data handling nodes communicating data to the given data routing node; (ii) assigning a power domain to the given data routing node in dependence upon the detected power domains and data traffic parameters of the set of one or more other data handling nodes; and (iii) assigning a clock domain to the given data routing node, from a set of one or more candidate clock domains applicable to the assigned power domain, so that the given data routing node, operating in the assigned clock domain, provides data routing according to the data traffic parameters of at least those of the set of one or more other data handling nodes operating according to the assigned power domain of the given data routing node.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which:

FIG. 1 schematically illustrates an example computer system;

FIGS. 3a and 3b are schematic flowcharts illustrating methods of integrated circuit design;

DESCRIPTION OF EMBODIMENTS

Figure 2:
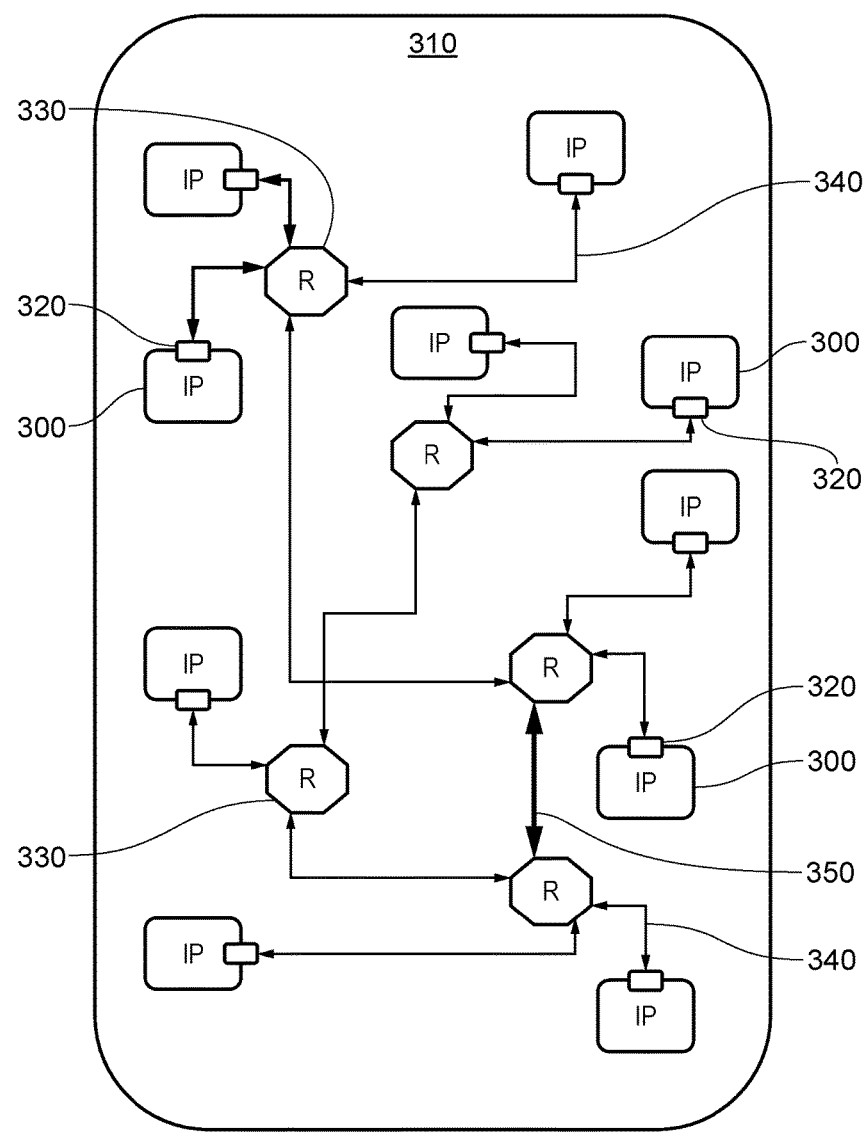
FIG. 2 schematically illustrates an NoC.

Before discussing the embodiments with reference to the accompanying figures, the following description of embodiments is provided.

An example embodiment provides a computer-implemented method of integrated circuit design, the method comprising: using a computer, detecting communication paths between data handling nodes, the data handling nodes comprising data source nodes, data sink nodes and data routing nodes operating according to respective power domains, clock domains and data traffic parameters, in a network of data handling nodes; and using the computer, for a given communication path in a direction of data flow from a data source node to a data sink node, for each given data routing node in the given communication path to which data is communicated in the direction of data flow by a set of one or more other data handling nodes: (i) detecting a power domain and data traffic parameters of each of the set of one or more other data handling nodes communicating data to the given data routing node; (ii) assigning a power domain to the given data routing node in dependence upon the detected power domains and data traffic parameters of the set of one or more other data handling nodes; and (iii) assigning a clock domain to the given data routing node, from a set of one or more candidate clock domains applicable to the assigned power domain, so that the given data routing node, operating in the assigned clock domain, provides data routing according to the data traffic parameters of at least those of the set of one or more other data handling nodes operating according to the assigned power domain of the given data routing node.

As discussed above, in an integrated circuit design process, a significant part of the design process is a method or step of assigning power properties to the various circuit elements. For any change in clock and power domain between two elements, a power and/or clock domain conversion circuit needs to be inserted as well, potentially leading to an increase in one or more of logic area, power and latency.

The example embodiments provide a computer-implemented technique to detect an assignment of power and clock domains to data handling nodes. Examples of the technique can provide a more efficient allocation, potentially alleviating the increase in one or more of logic area, power and latency.

The process can be carried out according to a single direction of data flow or, in situations where data can flow bidirectionally, it can be useful to carry it out in both directions. In example embodiments, in which the data handling nodes comprise master nodes and slave nodes, the method comprises: performing the steps (i)-(iii) for the given communication path in which the data source node is a given master node and the data sink node is a given slave node, in respect of a direction of data flow from the given master node to the given slave node so as to assign a first power domain and a first clock domain to each given data routing node in the given communication path; performing the steps (i)-(iii) for the given communication path in which the data source node is the given slave node and the data sink node is the given master node, in respect of a direction of data flow from the given slave node to the given master node so as to assign a second power domain and a second clock domain to each given data routing node in the given communication path; and selecting, for data routing nodes in the given communication path, either (a) the first power domain and the first clock domain, or (b) the second power domain and the second clock domain.

In order to select between the first and second outcomes, in example embodiments the selecting step comprises: detecting a number of power and clock domain conversions required for the given communication path when the first power domain and first clock domain are used for each data routing node in the given communication path; detecting a number of power and clock domain conversions required for the given communication path when the second power domain and second clock domain are used for each data routing node in the given communication path; and determining whether to use the first power domain and the first clock domain for each data routing node in the given communication path or the second power domain and the second clock domain for each data routing node in the given communication path, in dependence upon the detected numbers of power and clock domain conversions. In order to generate a solution which takes into account the whole device, the method may comprise performing the detecting steps for all communication paths in the network of data handling nodes. For example, the determining step may comprise determining which of using the first power domain and the first clock domain for each data routing node in the given communication path and using the second power domain and the second clock domain for each data routing node in the given communication path, provides a lower required number of power and clock domain conversions.

As part of the design process, the method may comprise using the computer, providing a power and clock domain conversion node at each circuit position at which a power and clock domain conversion is required.

An example of step (i) discussed above comprises: detecting which power domain, of a set of one or more power domains associated with the set of one or more other data handling nodes, is associated with the highest number of the set of one or more power domains. Another example of step (i) comprises: detecting which power domain, of a set of one or more power domains associated with the set of one or more other data handling nodes, is associated with those of the set of one or more power domains having data traffic parameters fulfilling a data traffic parameter condition. For example, the data traffic parameter condition may be a highest aggregate data traffic.

In some examples, both detections can be carried out, by step (i) comprising: detecting, which power domain, of a set of one or more power domains associated with the set of one or more other data handling nodes, is associated with the highest number of the set of one or more power domains; and detecting which power domain, of a set of one or more power domains associated with the set of one or more other data handling nodes, is associated with those of the set of one or more power domains having data traffic parameters fulfilling a data traffic parameter condition. In such a case, step (ii) can comprise assigning one of the two detected power domains, according to a selection criterion.

In some examples, the selection criterion can comprise whether a difference in aggregate data traffic between power domains of the set of one or more other data handling nodes exceeds a threshold difference. For example, the threshold difference can be a predetermined proportion of a greatest aggregate traffic amongst power domains of the set of one or more other data handling nodes. As another example, the selection criterion may comprise which of the power domains is associated with a data handling node of the set of one or more other data handling nodes having a lowest data communication latency requirement.

The present techniques can also advantageously be applied to other types of data handling nodes such as one or more non-routing nodes (such as, for example, serializer/deserializer nodes and/or data buffer nodes (such as pipeline registers)) providing a data path between a pair of ports; in this case, in example arrangements the method comprises, using the computer, for the given communication path in a direction of data flow from a data source node to a data sink node, for each given non-routing node in the given communication path to which data is communicated in the direction of data flow by a set of one or more other data handling nodes, performing the steps (i)-(iii) to assign a power domain and a clock domain to that given non-routing node.

As an optional step, the method can comprise the step of generating an integrated circuit layout according to the integrated circuit design.

Another example embodiment provides an integrated circuit having an integrated circuit design produced by the method as defined above.

Another example embodiment provides a computer program product comprising a non-transitory machine-readable storage medium on which are stored program instructions which, when executed by a computer processor, cause the computer processor to perform a method of integrated circuit design, the method comprising: detecting communication paths between data handling nodes, the data handling nodes comprising data source nodes, data sink nodes and data routing nodes operating according to respective power domains, clock domains and data traffic parameters, in a network of data handling nodes; and for a given communication path in a direction of data flow from a data source node to a data sink node, for each given data routing node in the given communication path to which data is communicated in the direction of data flow by a set of one or more other data handling nodes: (i) detecting a power domain and data traffic parameters of each of the set of one or more other data handling nodes communicating data to the given data routing node; (ii) assigning a power domain to the given data routing node in dependence upon the detected power domains and data traffic parameters of the set of one or more other data handling nodes; and (iii) assigning a clock domain to the given data routing node, from a set of one or more candidate clock domains applicable to the assigned power domain, so that the given data routing node, operating in the assigned clock domain, provides data routing according to the data traffic parameters of at least those of the set of one or more other data handling nodes operating according to the assigned power domain of the given data routing node.

Example embodiments of the present disclosure relate to a method performed by a computer or data processing system such as a computer processor. FIG. 1 is a schematic diagram of an example computer apparatus appropriate to the performance of such a method.

Referring to FIG. 1, various components are shown schematically, interconnected by a bus arrangement 170. Other components may also be provided even if they are not shown (for clarity of the diagram and explanation) in FIG. 1.

The example computer 100 comprises: a central processing unit (CPU) 110, a random access memory (RAM) 120, a non-volatile memory (NVM) 130 such as a hard disk drive, an interface (I/F) 140 for connecting to other components such as peripheral devices, a network connection, the internet and so on, a user interface (UI) 150 providing, for example, a keyboard, mouse, display or the like, and a non-transitory machine readable medium (NTMRM) 160 such as a magnetic or optical disk, a flash memory or other non-volatile memory or the like.

In example arrangements, the NTMRM 160 can embody a computer program product comprising the NTMRM 160 on which are stored program instructions which, when executed by the computer processor 110 of the computer 100, cause the computer processor to perform a method of the type described below, such as the method of FIG. 3b to be discussed below.

Example arrangements relate to the design, by a computer system, of an integrated circuit device such as a so-called network on chip (NoC), although the design of other types of integrated circuit is also envisaged within the scope of the present disclosure.

An NoC represents a system of interconnected processing devices or other devices embodied on a single integrated circuit. An example schematic representation of an NoC 310 is provided as FIG. 2. Here, multiple so-called IP blocks 300 are connected to one another to provide a network of such blocks. In this example, an "IP block" is a unit of circuitry with particular functionality, which typically (though not necessarily) represents the intellectual property or IP of a single party. Commonly, in integrated circuit design, these so-called IP blocks are treated as units within the integrated circuit design process, even though an IP block may comprise very many gates, transistors or other components in its own right. The term "IP block" is used here in a generic illustrative sense; the IP blocks 300 are simply functional blocks with the capability of communicating data with other such functional blocks. Their precise function is a matter of system design and is not relevant to the communication arrangements which will be discussed in more detail below. Similarly, although the term "IP block" implies ownership of rights in the module design, the present disclosure is not limited to any particular ownership arrangement.

So, for the purposes of FIG. 2, it is sufficient to note that the IP blocks 300 are capable of communicating with other IP blocks 300 within the NoC 310.

Communication between IP blocks may be according to so-called virtual channels (VCs). Virtual channels assign a respective time slot (in a time division multiplexed arrangement) or (in other examples) an identifier to packets being transmitted via a physical connection between two data handling nodes, so as to allow multiple communication paths (such as paths in each direction) to use that physical connection in such a way that packets associated with different VCs do not collide or otherwise interfere with one another.

Each IP block comprises a bridge 320 shown as a shaded box at an input/output of the IP block. The purpose of the bridge is as follows. In general terms, within an NoC such as the schematic NoC 310, data is transferred in packetized form, for example as so-called flits (flow control units). The routing and transmission of the flits is under the control of various interconnected routers (R) 330. The data transport mechanism used by the routers 330 and connections such as connections 340 between the routers and the IP blocks is generic, which is to say the same protocol is used regardless of the nature of the IP blocks 300 forming the NoC 310. In other words, the transport protocol is "agnostic" to the nature or design of the individual IP blocks. The bridges 320 convert a particular IP block's data protocol (which may not be necessarily a packetized protocol) into the generic transport protocol used by the network connections 340 and the routers 330. Similarly, for packets or flits received from the network, the bridges 320 convert the generic transport protocol of the network into the specific data input requirements of the respective IP block.

So, a particular bridge is specific to its associated IP block in terms of its interface with that IP block, but it generic to the network in terms of its interface with the network.

The routers 330 in FIG. 2 are shown schematically as octagonal blocks, which schematically represents the fact they are 8-port routers. However, other numbers of router ports could be provided. The routers could all have a similar design, or different types of routers could be used within a single NoC.

A data link 350 is drawn schematically using a wider or thicker line than other data links in the schematic representation of FIG. 2. This is to provide a schematic representation of a wider data link, which is to say that more conductors are provided so that the data link 350 can carry more data in parallel than other narrower data links of FIG. 2. This could represent a greater capacity of that data link in terms of bits per second transferred, if the data link 350 runs at the same clock speed as other, narrower, data links in FIG. 2. Alternatively, the clock speed of the data link 350 could be proportionately slower so that although more physical wires are used for the data link 350, its transport capacity in bits per second is the same as that of other data links such as the data links 340. In general, the data transport capacity of each of the data links is dependent upon by its width multiplied by its operating clock speed.

In the example of FIG. 2, between any one of the IP blocks 300 and any other one of the IP blocks 300, there is only one valid data transfer route. The routing is statically determined at the integrated circuit design stage. If the interconnection of routers 330 provides multiple potential data transport routes, a particular route between a first and a second IP block is selected and established statically in advance rather than being allocated dynamically in use. This provides a safer mode of operation avoiding potential deadlocks or other hazardous situations which might occur if the routing of data packets was selectable in operation. So, regardless of how many potential connections there are between a particular IP block pair of one IP block and another, the data will be routed by a pre-selected one of those connection routes.

Referring to FIG. 3a, the schematic diagram of FIG. 2 represents an example of a circuit design 370 forming an input to an integrated circuit design process implemented by a computer.

At a step 375, the computer processor generates a draft physical layout of the integrated circuit, using known techniques and involving selecting physical locations on an integrated circuit substrate for the various components of the integrated circuit according to parameters such as proximity to power supply rails and clock supply connectors, proximity to other components to which as physical connection is required, avoiding crosstalk of other unwanted interaction between conductors, and the like. The draft physical layout may include one or more other components (examples of so-called non-routing nodes) such as pipeline registers (data buffers) and serdes (serializer/deserializer nodes) providing a data path between a pair of ports and which will be discussed in more detail with reference to FIG. 4 below.

At a step 380, the computer processor allocates or assigns a power domain (PD) and clock domain (CD) to each of the router devices. PDs and CDs will be discussed in more detail below.

Then, at a step 385 the computer processor generates a final layout in which transitions between clock domains and/or power domains are handled by using so-called PCDC (power clock domain crossing) circuits. This provides an example of using the computer, providing a power and clock domain conversion node at each circuit position at which a power and clock domain conversion is (detected by the step 380 to be) required.

The production of the final layout at the step 385 represents the end of the process carried out by the computer processor, but at a further optional step 390, an integrated circuit is fabricated (by fabrication machinery) according to the finalised layout. The particular details of the fabrication process are not discussed further here. However, it is noted that the step 390 provides an example of generating an integrated circuit layout according to the integrated circuit design. Such an integrated circuit, having an integrated circuit design produced by the method defined above (including at least the step 380) is also considered as an embodiment of the present disclosure.

The step 380, that is to say, PD and CD assignment, represents at least a part of the computer-implemented integrated circuit design process. FIG. 3b provides more detail of operations relating to the step 380 and represents a method in its own right. In particular, FIG. 3b is a schematic flowchart illustrating a summary computer-implemented method of integrated circuit design, the method comprising:

using a computer such as the computer 100, detecting (at a step 200) communication paths between data handling nodes, the data handling nodes comprising data source nodes, data sink nodes and data routing nodes operating according to respective power domains, clock domains and data traffic parameters, in a network of data handling nodes; and using the computer, for a given communication path in a direction of data flow from a data source node to a data sink node, for each given data routing node in the given communication path to which data is communicated in the direction of data flow by a set of one or more other data handling nodes:

(i) detecting (at a step 210) a power domain and data traffic parameters of each of the set of one or more other data handling nodes communicating data to the given data routing node;

(ii) assigning (at a step 220) a power domain to the given data routing node in dependence upon the detected power domains and data traffic parameters of the set of one or more other data handling nodes; and (iii) assigning (at a step 230) a clock domain to the given data routing node, from a set of one or more candidate clock domains applicable to the assigned power domain, so that the given data routing node, operating in the assigned clock domain, provides data routing according to the data traffic parameters of at least those of the set of one or more other data handling nodes operating according to the assigned power domain of the given data routing node.

These steps will be discussed in more detail below.

Figure 4:
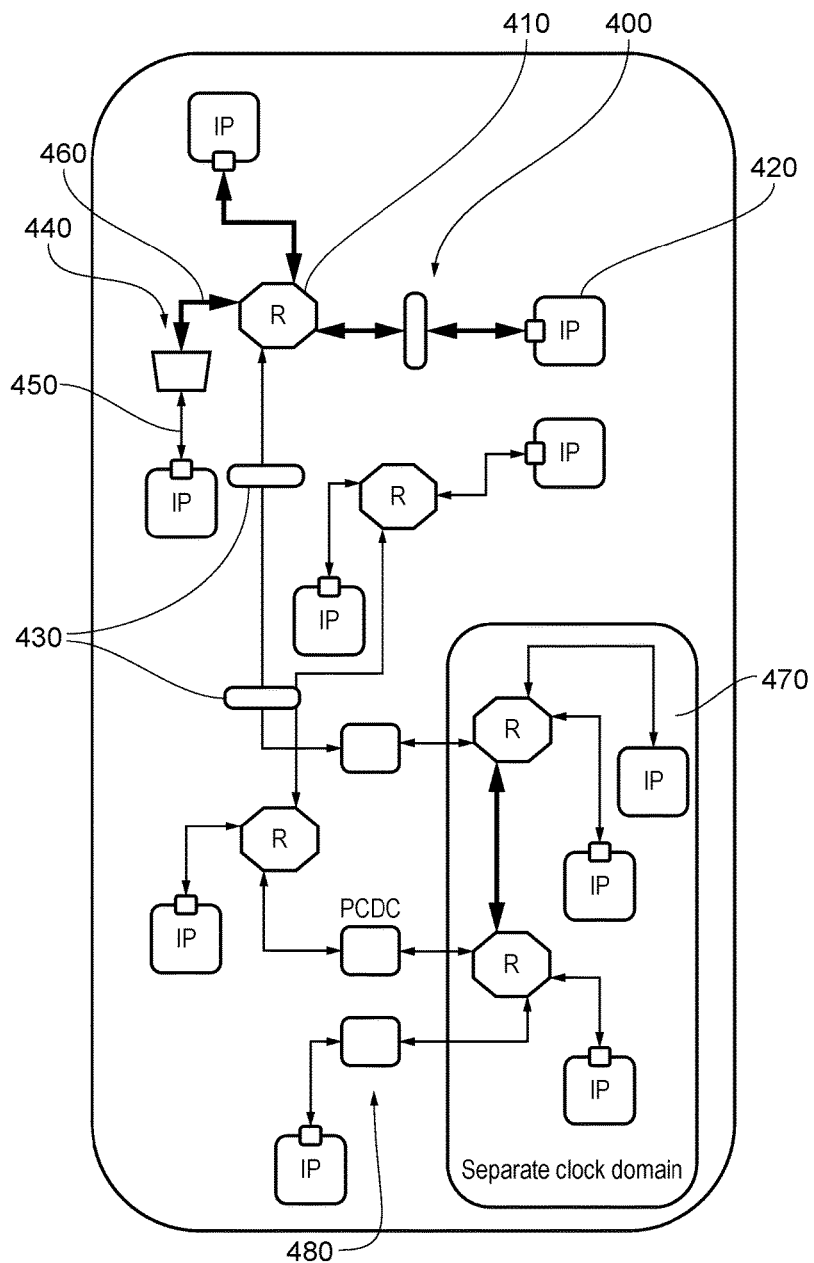
FIG. 4 schematically illustrates an NoC.

Turning to FIG. 4, the diagram does not necessarily directly represent a draft or final layout but does represent the further components and other factors introduced into such a layout, for the purposes of the present discussion.

A pipeline register 400 or data buffer is introduced where a length or distance of conductor between one component such as a router 410 and an IP block 420 is so long that transmission along that conductor would potentially cause issues if it were attempted to be carried out within a single clock cycle. So, by placing the pipeline register (or in the example case of pipeline registers 430, more than one pipeline register) along that conductor path, the transit between the components 410, 420 can be split into multiple partial transits, in respective clock cycles. For example, data can be transferred from the router 410 to the pipeline register 400 in a first clock cycle and then, in a next or subsequent clock cycle, from the pipeline register 400 to the IP block 420.

Serdes 440 are used to transition between data connections such as connections 450, 460 of different widths. Here, as discussed above, the width may refer to the number of conductors, or in other words the quantity of data which can be conveyed in parallel. In the example shown, the data path 450 has a narrower width than the data path 460. So, in the case of transmission of a packet on the (wider) data path 460 from the router 410 to the serdes 440, the data packet is received and buffered by the serdes 440 and then output as multiple successive packets on the narrower data connection 450. Similarly, an incoming packet on the data connection 450 is buffered at the serdes 440 and can be aggregated with other incoming packets to form a suitably wider packet for transmission on the data connection 460. In general terms, serdes are used to manage transitions between data connections of different widths.

The IP blocks or other components such as routers operate in various power domains and clock domains. In FIG. 4, just two clock domains are shown, one for a circuitry region 470 and one for the remainder of the NoC. However, as discussed below, multiple power domains and clock domains can be provided. At an interface between two different domains, a so-called PCDC circuit, for example implemented as an asynchronous FIFO, is provided. Examples of PCDC circuits 480 are shown in FIG. 4 at transitions between the clock domain 470 and the remainder of the NoC of FIG. 4. PCDC circuits are needed at each such transition, but the introduction of PCDC circuits can lead to an increase in one or more: circuit area on the integrated circuit substrate; power consumption; and data transmission latency. Therefore, using the present techniques (of FIG. 3b) which represent an embodiment of the step 380 of FIG. 3a, techniques are provided to assign power domains and clock domains to circuit elements of the NoC, for example in such a way as to provide an improved or potentially improved efficiency of use of PCDC circuits. Further details of the present embodiments of the circuits will be discussed below.

The circuitry of FIG. 4 can be represented as a so-called graph. This does not change the logical interconnections between nodes within the circuitry but simply provide a representation in which the paths between them can more easily be envisaged. So, FIG. 5 is an example graph illustrating, purely as an example, connections between three IP blocks 500, labelled as master (M) 0, master 1 and slave (S) 0.

The master and slave nodes are example categorizations of the IP blocks, in that a master node can initiate a data transfer transaction with a slave node; the slave node can respond to such a transaction but a slave node cannot itself initiate such a transaction. However, having said this, in the course of a data transfer transaction initiated by a master node and occurring with a slave node, there can be data transferred in either direction. For example, in the case of a data write transaction, the master node sends data to the slave node to be written, and the slave node sends an acknowledgement back to the master node. In the case of a data read transaction, the master node sends data to the slave node indicating or specifying the data to be read, and the slave node returns the requested data to the master node. So, a typical transaction between a master and a slave node can involve both data flow directions, from the master to the slave and from the slave to the master. However, the difference between the master and the slave is which of the nodes can initiate or request that transaction.

Figure 5:
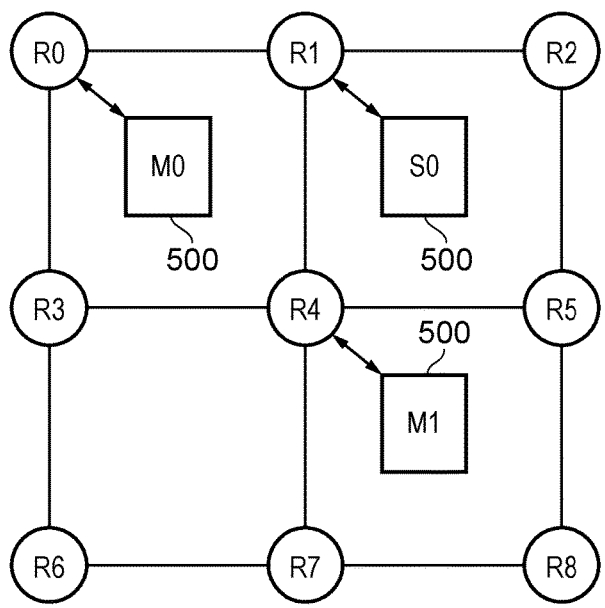
FIG. 5 schematically illustrates a network graph representation.

Connections between the IP blocks 500 in FIG. 5 are provided by routers as discussed above. In particular, three routers R0, R1 and R4 are involved in data transfer between the three IP blocks 500. Other routers are shown schematically in FIG. 5 and may be involved in other data transfers not represented by the simplified example of FIG. 5. Solid lines between data handling nodes (IP blocks and routers) schematically represent data connections.

Figure 6:
FIGS. 6 and 7 schematically illustrate data communication paths.
Figure 6:
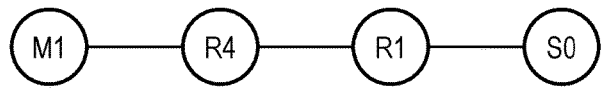
Figure 7:
Figure 7:

Another representation of the routing of data in FIG. 5 is provided in FIG. 6 in which, starting at the left hand side representing a master node M0 or M1, the series of routers involved in a data connection with the slave node S0 is shown. So, from the master node M0, data is transferred to the router R0, then to the router R1, then to the slave node S0. From the master node M1, data is routed to the router R4, then to the router R1, then to the slave node S0. These interconnections can be represented equivalently by the representation of FIG. 7, given that the router R1 and the slave node S0 are common between the two paths.

Power domains and clock domains will now be discussed before further detail of the power domain and clock domain assignment techniques is provided.

Figure 8:
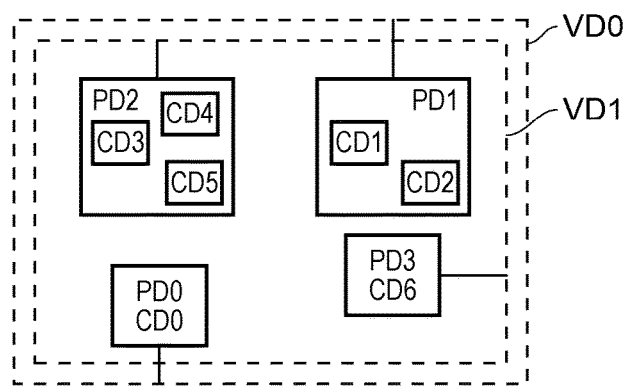
FIG. 8 schematically illustrates an NoC.
Figure 9:
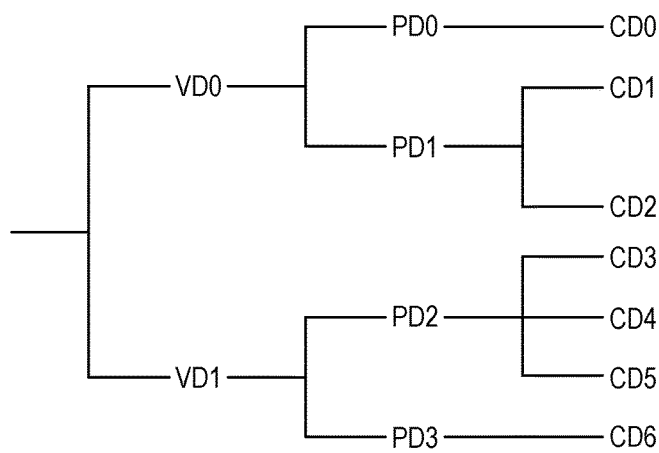
FIG. 9 schematically illustrates a hierarchy of voltage, power and clock domains.

Referring to FIGS. 8 and 9, example circuitry such as an NoC device of the type discussed above is provided with two voltage supplies or rails referred to as VD0 and VD1 (voltage domain 0 and voltage domain 1). Respective portions of circuitry within the NoC device are physically connected to either VD0 or VD1. Each of these portions of circuitry corresponds to a respective power domain PD0 . . . PD3. The power domains form a hierarchy under the voltage domains such that (as shown in FIG. 9) within the voltage domain VD0, power domains PD0 and PD1 are provided, and within the voltage domain VD1, power domains PD2 and PD3 are provided.

Clock domains are made available within the circuitry associated with a particular power domain. As shown in FIGS. 8 and 9, within circuitry in power domain PD0, a single clock domain CD0 is available. Within the circuitry associated with power domain PD1, two different clock domains CD1, CD2 are available. Within the circuitry associated with PD1, three clock domains CD3, CD4, CD5 are available, and within circuitry associated with PD3, one clock domain PD6 is available.

As part of the preparation of the initial circuit at the step 370 of FIG. 3a, power domains and clock domains are generally associated with the IP blocks of the NoC. However, between IP blocks, the routers (which represent a part of the design process represented by the step 375 . . . 385 of FIG. 3a) can be assigned to various different power domains and clock domains as part of the computer-implemented layout design process.

In a simple example of two IP blocks having different power and clock domains with a single router between them, the intervening router can be associated (as part of the computer-implemented layout design process) with the power and clock domains of the master device or the power and clock domains of the slave device. In general terms, either option would provide a working circuit. If the single router were associated with the power and clock domains of the master device, a PCDC circuit would be required between the router and the slave device. If the single router were associated with the power and clock domains of the slave device, a PCDC circuit would be required between the router and the master device. So in some respects the selection is arbitrary, in that either option would work. But in a complicated circuit having many different IP blocks and interconnected routers, the choice of power and clock domains for the routers can make a large difference to the number and nature of the required PCDC circuits, because different choices of power and clock domains for the individual routers can vary the overall number of clock and/or power domain transitions within the overall circuit. So in that sense, the choice is not arbitrary. As mentioned above, it can be desirable to reduce the number of PCDC circuits (and, in other examples, avoid their use in certain high traffic data paths) in order to improve the efficiency of layout and/or operation of the integrated circuit. The present techniques aim to provide a method which can improve the allocation or assignment of clock and power domains.

Figure 10:
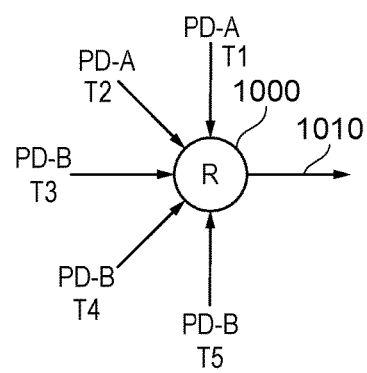
FIG. 10 schematically illustrates connections to a data handling node.

FIG. 10 schematically illustrates an example router (R) 1000. It forms part of circuitry represented by the type of representation shown in FIG. 7 and described above, except that as inputs to the router 1000 there are connections with five other data handling nodes (nodes such as master nodes, slave nodes or other routers). Each of these has an associated power domain, assigned in the design 370 (in the case of master nodes or slave nodes) or already assigned by the present process (given that the flow of the process as described is in a data flow direction). In the example shown in FIG. 10, two power domains are represented amongst the five inputs to the router 1000, namely power domains PD-A and PD-B. However, this is just an example; more than (or fewer than) two power domains could be represented amongst the inputs to a given router.

Also associated with each input to the router 1000 are so-called traffic parameters. These could define a required data transport speed or bandwidth, for example represented as a required number of bits per second or bytes per second, and/or other traffic parameters such as a maximum permissible latency. The traffic parameters in FIG. 10 are shown as parameters T1, T2, T3, T4 and T5.

An output 1010 from the router passes to the next data handling node in the circuit representation.

Figure 11:
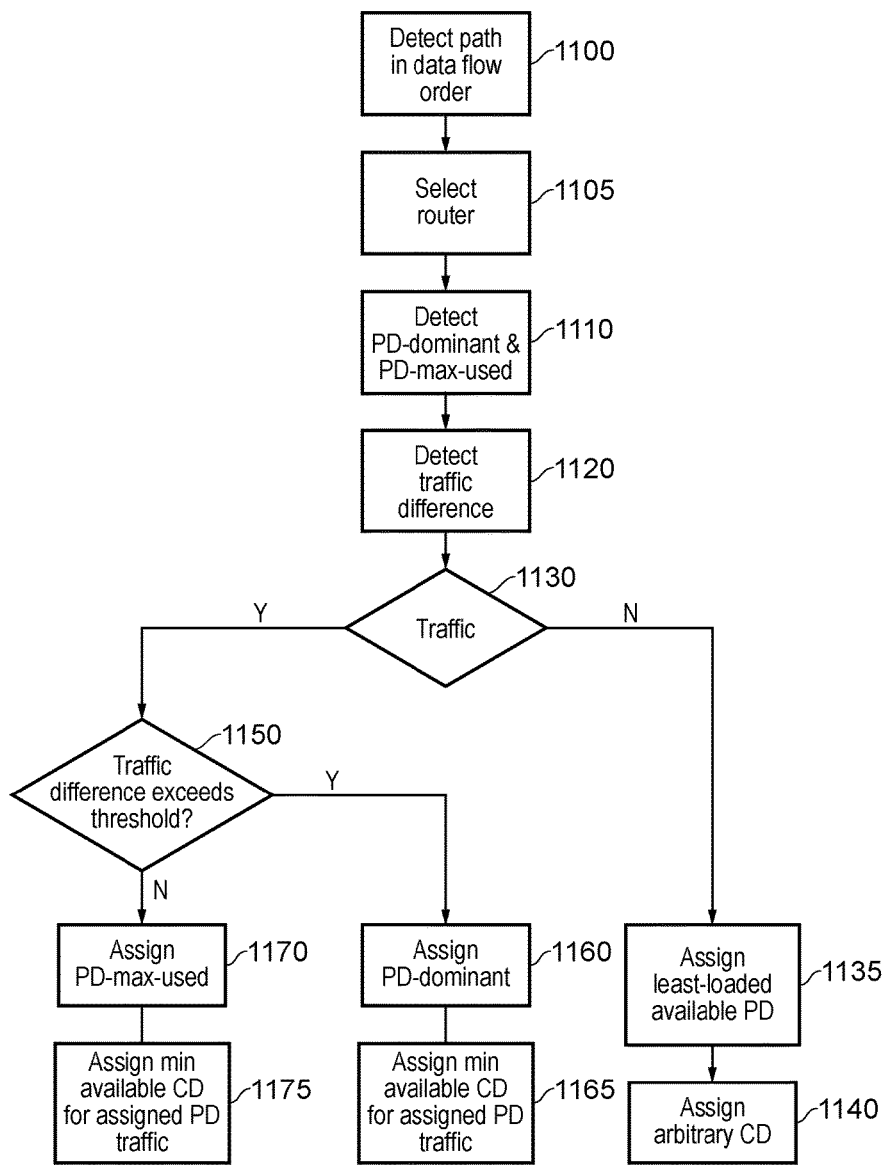
FIGS. 11 and 12 are schematic flowcharts illustrating respective methods.

FIG. 11 is a schematic diagram representing in more detail an example arrangement falling within the scope of the computer-implemented method of integrated circuit design shown in FIG. 3b and described above.

The flowchart of FIG. 11 relates to the assignment of a power domain and a clock domain to a particular router in a data communication path of a particular data flow direction. Then, this method will be used within another flowchart in FIG. 12 to be discussed below, indicating how these techniques can be used across multiple routers in a circuit.

Figure 13:
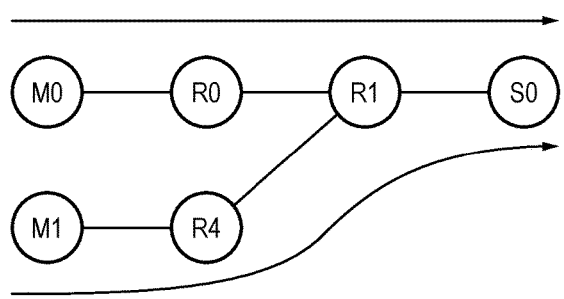
FIGS. 13 and 14 schematically illustrate data flow in data communication paths.
Figure 14:
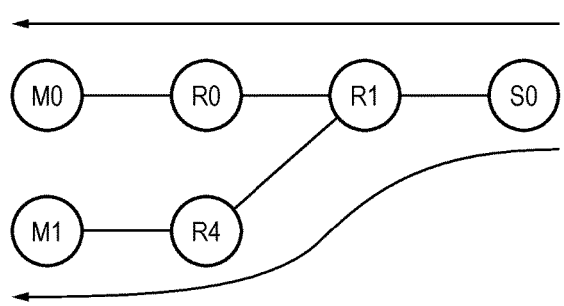

Referring to FIG. 11, at a step 1100, a data communication path is detected in a data flow order. For example, the order could be from the master node to the slave node, as shown by a schematic representation of FIG. 13, or from a slave node to a master node as shown by a schematic representation of FIG. 14. In some examples of the arrangement shown in FIG. 12 and described below, both directions are considered and the results compared in various ways. For the purposes of FIG. 11, however, either a direction from master to slave or a direction from slave to master is selected. Note again that as discussed above, even though the master devices are responsible for initiating data transfer transactions, data can be passed in either direction during implementation of such a data transfer transaction. The step 1100 therefore provides an example of using a computer, detecting communication paths between data handling nodes, the data handling nodes comprising data source nodes, data sink nodes and data routing nodes operating according to respective power domains, clock domains and data traffic parameters, in a network of data handling nodes.

At a step 1105, a router within the particular data communication path under consideration is selected. As mentioned above, generally speaking, IP blocks (forming the master and slave nodes) tend to be assigned to power and clock domains in the preparation in the initial circuit design 370. So, in the present examples, the present process is applied to router nodes. A particular router is selected for analysis at the step 1105. Therefore, using the computer, for a given communication path in a direction of data flow from a data source node to a data sink node, the process is performed for a given data routing node in the given communication path to which data is communicated in the direction of data flow by a set of one or more other data handling nodes. (According to a step 1210/1225 to be discussed below, the process can be carried out for each given router).

At a step 1110, two parameters are detected: PD-dominant and PD-max-used.

Referring to the example of FIG. 10, PD-dominant is derived as follows:
List the candidate PD for each input to the router (so as to detect a power domain and data traffic parameters of each of the set of one or more other data handling nodes communicating data to the given data routing node), noting that because the present method proceeds in a data flow direction, each input to the router will have only one candidate PD; and
Select the candidate PD for which the associated group of one or more inputs has the greatest aggregate traffic across all of its virtual channels.

So, in the example case of FIG. 10, the candidate PDs are PD-A and PD-B. Assuming that the traffic parameters T1 . . . T5 represent (for example) a required bit rate or byte transfer rate, the aggregate traffic for PD-A is T1+T2. The aggregate traffic for PD-B is T3+T4+T5. Whichever of these aggregate traffic values ((T1+T2) or (T3+T4+T5)) is greater provides an indication of whether to select PD-A or PD-B as the parameter PD-dominant.

PD-max-used is derived as follows:
For each input to the router 1000 (referring to the example of FIG. 10), find the associated PD of the node sending data to that router 1000; and
Select the power domain which corresponds to the greatest number of such inputs.

So, in the example of FIG. 10, PD-B (being associated with three inputs, rather than the two inputs associated with PD-A) is the PD-max-used parameter for the router 1000.

So, the step 1110 results in the detection of two parameters, PD-dominant and PD-max-used. In the present example, assume (just for the purposes of the present discussion) that the traffic figures led to the selection of PD-A as PD-dominant, and the number of inputs led to the selection of PD-B as PD-max-used. However, in other examples, just one parameter could be detected and that parameter used as the selection of the PD for that router. In the case that two (or more) such parameters are detected, each having associated power domains, the method can comprise (as the outcomes of the steps 1130, 1150) assigning one of the two (or more) detected power domains, according to a selection criterion.

The detection of the parameter PD-max-used, as discussed above, provides an example of detecting which power domain, of a set of one or more power domains associated with the set of one or more other data handling nodes, is associated with the highest number of the set of one or more power domains.

The detection of the parameter PD-dominant, as discussed above, provides an example of detecting which power domain, of a set of one or more power domains associated with the set of one or more other data handling nodes, is associated with those of the set of one or more power domains having data traffic parameters fulfilling a data traffic parameter condition. For example, the data traffic parameter condition may be a highest aggregate data traffic.

Various criteria can then be used to decide whether to assign PD-dominant or PD-max-used (or, indeed, another PD) to the router 1000. An example to be discussed here is based upon traffic parameters.

At a step 1120, the traffic difference between the PD with maximum traffic and that with a minimum amongst those forming an input to the router 1000 is detected. In the example of FIG. 10, there are only two PDs represented, and (based on the assumption that PD-dominant is PD-A) it is assumed that (T1+T2) is greater than (T3+T4+T5). The difference in traffic is therefore ((T1+T2)−(T3+T4+T5)). However, if more PDs were associated with inputs, the step 1120 would detect the difference between that PD having the greatest associated traffic and that PD having the lowest associated traffic.

This traffic difference figure will be used to decide which PD to assign. First, however, an optional step 1130 detects whether there is even any traffic at that router. If the answer is no then at a step 1135, an arbitrary one of the available PDs is assigned to the router, for example the least-loaded available PD (which is to say, the PD available at that physical location in the draft laid-out integrated circuit which has the fewest nodes currently associated with it and/or which has the lowest current draw currently associated with it). An arbitrary clock domain is simply assigned as the lowest frequency clock domain from the least loaded power domain in the system (at a step 1140) because there is no traffic at that router.

Assuming, however, that the router does carry traffic, then at a step 1150 a detection is made as to whether the traffic difference detected at the step 1120 exceeds a threshold.

The threshold could be, for example, 20% of the higher traffic value (T1+T2), or 20% of the lower value (T3+T4+T5). Or another proportion could be used other than 20%, which is simply an example. Or a fixed threshold (which is to say, one which does not depend on the particular traffic values under consideration) such as a threshold difference of 100 MBPS (megabytes per second) could be used.

These arrangements provide an example in which the selection criterion comprises whether a difference in aggregate data traffic between power domains of the set of one or more other data handling nodes exceeds a threshold difference. For example the threshold difference may be a predetermined proportion (such as 20% of a greatest aggregate traffic amongst power domains of the set of one or more other data handling nodes.

If the traffic difference exceeds the threshold, then control passes to a step 1160 at which the power domain PD-dominant is assigned to that router 1000. Then, at a step 1165, a clock domain is assigned to the router 1000 as follows. The assigned clock domain is one which is available within the power domain PD-dominant, and amongst those which are available within that power domain, the minimum clock speed which maintains the traffic throughput for the maximum traffic power domain PD-dominant (in this case, T1+T2) is selected.

If the outcome at the step 1150 is no, control passes to a step 1170 at which the power domain PD-max-used is assigned to that router 1000. Again, of those clock domains available within the power domain PD-max-used, the minimum clock speed which will provide for the traffic level (T3+T4+T5) of the power domain PD-max-used is assigned at a step 1175.

The steps 1135, 1160, 1170 provide an example of assigning a power domain to the given data routing node in dependence upon the detected power domains and data traffic parameters of the set of one or more other data handling nodes. The steps 1165, 1175 provide an example of assigning a clock domain to the given data routing node, from a set of one or more candidate clock domains applicable to the assigned power domain, so that the given data routing node, operating in the assigned clock domain, provides data routing according to the data traffic parameters of at least those of the set of one or more other data handling nodes operating according to the assigned power domain of the given data routing node. If, at the step 1175, it is the case that none of the clocks associated with the PD-max-used can support sufficient data bandwidth required by that data handling node, another PD can be selected from those available at that physical location.

The process of FIG. 11 has been described with respect to routers. It may also be other data handling nodes such as non-routing nodes (such as serializer/deserializer nodes and/or data buffer or pipeline nodes) providing a data path between a pair of ports. Here, because (in the direction of data flow) there is only one input, PD-dominant and PD-max-used may be the same PD. In such examples, the method comprises, using the computer, for the given communication path in a direction of data flow from a data source node to a data sink node, for each given non-routing node in the given communication path to which data is communicated in the direction of data flow by a set of one or more other data handling nodes, performing the steps (i)-(iii) to assign a power domain and a clock domain to that given non-routing node.

Figure 12:
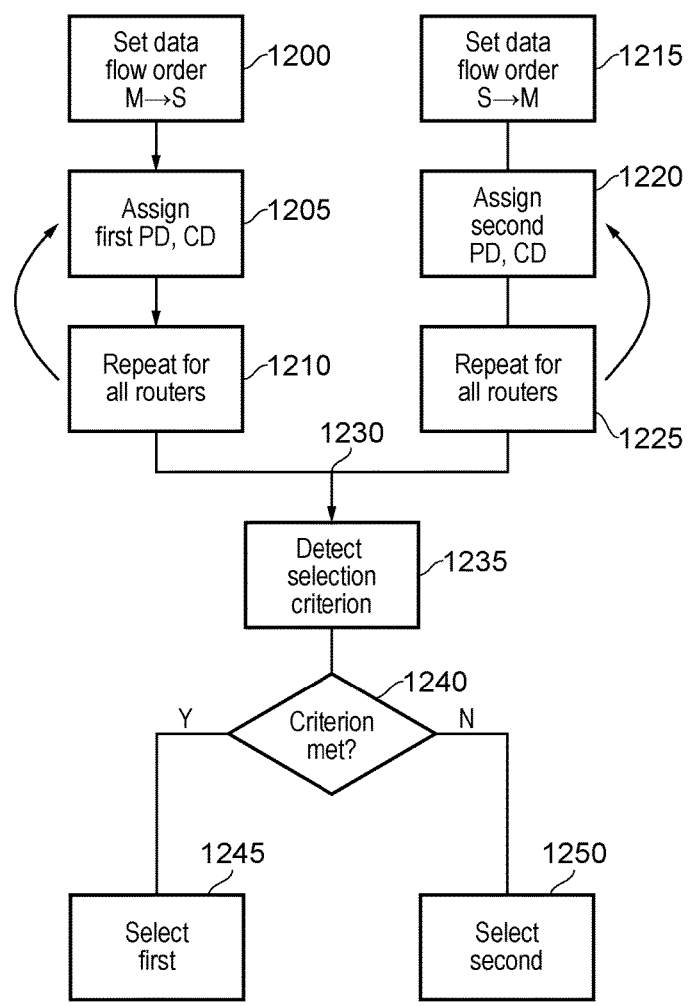

As mentioned above, the arrangement of FIG. 11 related to an operation which may be carried out in respect of a single router or a single non-routing node and a single data flow direction. FIG. 12 provides an optional process to build upon these detections and assign PD and CD parameters to multiple routers in an NoC.

A process is carried out starting at a step 1200 to perform the process of FIG. 11 based on a data flow order from master to slave nodes within the data communication paths. This results in the assignment at a step 1205 of a first PD and a first CD to each router. The process is repeated across all routers in the draft layout at a step 1210, which may involve multiple iterations of the step 1205.

The term "first" PD, CD and (as used later) "second" PD, CD are simply terms to distinguish between a pair of sets of parameters for PD, CD and do not imply any order of priority, preference or generation between the sets of parameters.

A similar process is carried out starting at a step 1215 at which a data flow order is established as slave node to master node, a second PD, CD pair is assigned to each router at a step 1220 and, at a step 1225 the step 1220 is repeated across all routers.

The steps 1210, 1225 provide an example of performing the detecting steps for all communication paths in the network of data handling nodes.

The steps 1200 . . . 1210 and the steps 1215 . . . 1225 can be carried out in series, or in parallel as shown schematically in FIG. 12. The outcome, at a point 1230 in the flowchart of FIG. 12 is a pair of sets of PD, CD parameters (first and second sets) for each router in a communication path. The first PD, CD parameters are derived by analysing in a data flow order from master to slave, and a second PD, CD parameters are derived by analysis in a data flow order form slave to master.

Therefore, in a case in which the data handling nodes comprise master nodes and slave nodes, an example of the method comprises: performing (1200, 1205) the steps (i)-(iii) for the given communication path in which the data source node is a given master node and the data sink node is a given slave node, in respect of a direction of data flow from the given master node to the given slave node so as to assign a first power domain and a first clock domain to each given data routing node in the given communication path; performing (1215, 1220) the steps (i)-(iii) for the given communication path in which the data source node is the given slave node and the data sink node is the given master node, in respect of a direction of data flow from the given slave node to the given master node so as to assign a second power domain and a second clock domain to each given data routing node in the given communication path; and selecting (1235 onwards), for data routing nodes in the given communication path, either (a) the first power domain and the first clock domain, or (b) the second power domain and the second clock domain.

At a step 1235, a selection criterion (or more than one selection criteria) is detected. Examples of such selection criteria will be discussed below.

At a step 1240, if the criterion is met, then control passes to a step 1245 at which the first PD, CD pair is selected. Otherwise, control passes to a step 1250 at which the second CD, PD is selected. The selection is made for all routers in a communication path, which is to say either all routers in that communication path are assigned the first PD, CD pair or all routers in the communication path are assigned the second PD, CD pair.

Examples of the selection criterion used at the step 1235 are that according to each set (first and second) of PD, CD pairs, the number of PCDC circuits required is detected. As discussed above, a PCDC circuit is required at any transition between power and clock domains, so for any two adjacent nodes in a communication path, a PCDC circuit is required if either or both of the power or clock domains is different between those two nodes. So, the number of PCDC circuits can be detected by detecting differences between adjacent nodes in each communication path. The criterion can then be a detection of which set of PD, CD parameters gives rise to the lowest number of PCDC circuits being required, or—in the format shown in the FIG. 12—the criterion can be "does the use of the first PD, CD pair give rise to a lower number of PCDC circuits being required?". This provides an example of detecting a number of power and clock domain conversions required for the given communication path when the first power domain and first clock domain are used for each data routing node in the given communication path; detecting a number of power and clock domain conversions required for the given communication path when the second power domain and second clock domain are used for each data routing node in the given communication path; and determining whether to use the first power domain and the first clock domain for each data routing node in the given communication path or the second power domain and the second clock domain for each data routing node in the given communication path, in dependence upon the detected numbers of power and clock domain conversions. This also provides an example of determining which of using the first power domain and the first clock domain for each data routing node in the given communication path and using the second power domain and the second clock domain for each data routing node in the given communication path, provides a lower required number of power and clock domain conversions.

Another example is one in which the selection criterion comprises which of the power domains is associated with a data handling node of the set of one or more other data handling nodes having a lowest data communication latency requirement.

Finally, as part of the integrated circuit design process at the step 385, according to the selected (assigned) PD/CD pairs, the appropriate PCDC circuits are provided as part of the layout design within the NoC.

Various alternative arrangements are possible and are within the scope of the present disclosure.

For example, the traffic parameters used in any of the above techniques could be weighted according to a traffic class, so that instead of comparing traffic parameters which directly indicate rates of data flow, the indications could be weighted so as to assign more or less significance to some classes of traffic.

If a PD is not available in a given physical location in a final layout, another PD could be assigned.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device (such as a processing element as discussed above) may be programmed to perform the function. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. A computer-implemented method of generating an integrated circuit design, the method comprising:
   using a computer, detecting communication paths between data handling nodes, the data handling nodes comprising data source nodes, data sink nodes and data routing nodes operating according to respective power domains, clock domains and data traffic parameters, in a network of the data handling nodes; and
   using the computer, for a given communication path in a direction of data flow from a data source node to a data sink node, for each given data routing node in the given communication path to which data is communicated in the direction of data flow by a set of one or more other data handling nodes, to perform the following steps:
   (i) detecting a power domain and data traffic parameters of each data handling node of the set of one or more other data handling nodes communicating data to said each given data routing node;
   (ii) assigning a power domain to said each given data routing node in dependence upon the detected power domains and the detected data traffic parameters of the set of one or more other data handling nodes; and
   (iii) assigning a clock domain to said each given data routing node, from a set of one or more candidate clock domains applicable to the assigned power domain, so that said each given data routing node, operating in the assigned clock domain, provides data routing according to the detected data traffic parameters of at least those of the set of one or more other data handling nodes operating according to the assigned power domain of said each given data routing node.

2. The method of claim 1, wherein the data handling nodes comprise master nodes and slave nodes, the method comprising:
   performing the steps (i)-(iii) for the given communication path wherein the data source node is a given master node and the data sink node is a given slave node, in respect of a direction of data flow from the given master node to the given slave node so as to assign a first power domain and a first clock domain to each given data routing node in the given communication path;
   performing the steps (i)-(iii) for the given communication path wherein the data source node is the given slave node and the data sink node is the given master node, in respect of a direction of data flow from the given slave node to the given master node so as to assign a second power domain and a second clock domain to each given data routing node in the given communication path; and selecting, for data routing nodes in the given communication path, either (a) the first power domain and the first clock domain, or (b) the second power domain and the second clock domain.

3. The method of claim 2, wherein the selecting step comprises:
detecting a number of power and clock domain conversions required for the given communication path when the first power domain and the first clock domain are used for each data routing node in the given communication path;
detecting a number of power and clock domain conversions required for the given communication path when the second power domain and the second clock domain are used for each data routing node in the given communication path; and
determining whether to use the first power domain and the first clock domain for each data routing node in the given communication path or the second power domain and the second clock domain for each data routing node in the given communication path, in dependence upon the detected numbers of power and clock domain conversions.

4. The method of claim 3, further comprising performing the detecting steps for all communication paths in the network of data handling nodes.

5. The method of claim 4, wherein the determining step comprises determining which of using the first power domain and the first clock domain for each data routing node in the given communication path and using the second power domain and the second clock domain for each data routing node in the given communication path, provides a lower required number of power and clock domain conversions.

6. The method of claim 5, comprising:
using the computer, providing a power and clock domain conversion node at each circuit position at which a power and clock domain conversion is required.

7. The method of claim 1, wherein the step (i) comprises:
detecting which power domain, of a set of one or more power domains associated with the set of one or more other data handling nodes, is associated with a highest number of the set of one or more power domains.

8. The method of claim 1, wherein the step (i) comprises:
detecting which power domain, of a set of one or more power domains associated with the set of one or more other data handling nodes, is associated with those of the set of one or more power domains having data traffic parameters fulfilling a data traffic parameter condition.

9. The method of claim 8, wherein the data traffic parameter condition is a highest aggregate data traffic.

10. The method of claim 1, wherein the step (i) comprises:
detecting, which power domain, of a set of one or more power domains associated with the set of one or more other data handling nodes, is associated with a highest number of the set of one or more power domains; and
detecting which power domain, of a set of one or more power domains associated with the set of one or more other data handling nodes, is associated with those of the set of one or more power domains having data traffic parameters fulfilling a data traffic parameter condition;

and the step (ii) comprises:
assigning one of the two detected power domains, according to a selection criterion.

11. The method of claim 10, wherein the selection criterion comprises whether a difference in an aggregate data traffic between power domains of the set of one or more other data handling nodes exceeds a threshold difference.

12. The method of claim 11, wherein the threshold difference is a predetermined proportion of a greatest aggregate data traffic amongst power domains of the set of one or more other data handling nodes.

13. The method of claim 10, wherein the selection criterion comprises which of the power domains is associated with a data handling node of the set of one or more other data handling nodes having a lowest data communication latency requirement.

14. The method of claim 1, wherein the data handling nodes comprise one or more non-routing nodes providing a data path between a pair of ports;
the method comprises, using the computer, for the given communication path in a direction of data flow from a data source node to a data sink node, for each given non-routing node in the given communication path to which data is communicated in the direction of data flow by a set of one or more other data handling nodes, performing the steps (i)-(iii) to assign a power domain and a clock domain to said each given non-routing node.

15. The method of claim 14, wherein the non-routing nodes comprise one or more of:
serializer/deserializer nodes; and
data buffer nodes.

16. The method of claim 1, further comprising a step of:
generating an integrated circuit layout according to the integrated circuit design.

17. An integrated circuit having an integrated circuit design generated by the method of claim 1.

18. A computer program product comprising a non-transitory machine-readable storage medium on which are stored program instructions which, when executed by a computer processor, cause the computer processor to perform a method of generating an integrated circuit design, the method comprising:
detecting communication paths between data handling nodes, the data handling nodes comprising data source nodes, data sink nodes and data routing nodes operating according to respective power domains, clock domains and data traffic parameters, in a network of data handling nodes; and
for a given communication path in a direction of data flow from a data source node to a data sink node, for each given data routing node in the given communication path to which data is communicated in the direction of data flow by a set of one or more other data handling nodes, to perform the following steps:
(i) detecting a power domain and data traffic parameters of each data handling node of the set of one or more other data handling nodes communicating data to said each given data routing node;
(ii) assigning a power domain to said each given data routing node in dependence upon the detected power domains and the detected data traffic parameters of the set of one or more other data handling nodes; and
(iii) assigning a clock domain to said each given data routing node, from a set of one or more candidate clock domains applicable to the assigned power domain, so that said each given data routing node, operating in the assigned clock domain, provides data routing according to the detected data traffic parameters of at least those of the set of one or more other data handling nodes operating according to the assigned power domain of said each given data routing node.

* * * * *